US009466715B2

(12) United States Patent
Cheng et al.

(10) Patent No.: US 9,466,715 B2
(45) Date of Patent: Oct. 11, 2016

(54) MOS TRANSISTOR HAVING A GATE DIELECTRIC WITH MULTIPLE THICKNESSES

(71) Applicant: TAIWAN SEMICONDUCTOR MANUFACTURING CO., LTD., Hsinchu (TW)

(72) Inventors: Chih-Chang Cheng, Hsinchu (TW); Fu-Yu Chu, Hsinchu (TW); Ruey-Hsin Liu, Hsin-Chu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 4 days.

(21) Appl. No.: 14/015,350

(22) Filed: Aug. 30, 2013

(65) Prior Publication Data

US 2015/0061011 A1    Mar. 5, 2015

(51) Int. Cl.
| | | |
|---|---|---|
| *H01L 29/78* | (2006.01) | |
| *H01L 29/06* | (2006.01) | |
| *H01L 29/51* | (2006.01) | |
| *H01L 29/423* | (2006.01) | |
| *H01L 29/66* | (2006.01) | |
| *H01L 21/8234* | (2006.01) | |
| *H01L 21/336* | (2006.01) | |
| *H01L 21/02* | (2006.01) | |

(52) U.S. Cl.
CPC ... *H01L 29/7833* (2013.01); *H01L 21/823462* (2013.01); *H01L 29/42364* (2013.01); *H01L 29/42368* (2013.01); *H01L 29/66659* (2013.01); *H01L 29/66681* (2013.01); *H01L 29/66689* (2013.01); *H01L 29/7816* (2013.01); *H01L 21/0226* (2013.01); *H01L 29/513* (2013.01)

(58) Field of Classification Search
CPC .................................. H01L 29/42368
USPC ................................. 257/335, 336
See application file for complete search history.

(56) References Cited

U.S. PATENT DOCUMENTS

| | | | |
|---|---|---|---|
| 5,741,737 A * | 4/1998 | Kachelmeier | 438/286 |
| 7,692,134 B2 * | 4/2010 | Nagaraja | H01L 27/14603 250/214.1 |
| 8,829,613 B1 * | 9/2014 | Pendharkar | H01L 29/41766 257/335 |

(Continued)

OTHER PUBLICATIONS

Radhakrishnan Sithanandam and M Jagadesh Kumar. "Linearity and speed optimization in SOI LDMOS using gate engineering", Published Dec. 8, Semiconductor Science and Technology, vol. 25, No. 1.*

*Primary Examiner* — Victor A Mandala
*Assistant Examiner* — Regan J Rundio
(74) *Attorney, Agent, or Firm* — McDermott Will & Emery LLP

(57) ABSTRACT

A novel MOS transistor including a well region, a gate dielectric layer, a gate electrode, a source region and a drain region is provided. The well region of a first conductivity type extends into a semiconductor substrate. The gate dielectric layer is located over the well region. The gate electrode is located over the gate dielectric layer. The source region of a second conductivity type opposite to the first conductivity type and a drain region of the second conductivity type are located in the well region and on opposite sides of the gate electrode. The gate dielectric layer has a first portion and a second portion respectively closest to the source region and the drain region. The thickness of the second portion is greater than that of the first portion, so as to raise breakdown voltage and to maintain current simultaneously.

8 Claims, 6 Drawing Sheets

(56) References Cited

U.S. PATENT DOCUMENTS

| | | | |
|---|---|---|---|
| 2001/0042889 A1* | 11/2001 | Kang | 257/371 |
| 2002/0079509 A1* | 6/2002 | Efland | H01L 29/086 257/196 |
| 2004/0084710 A1* | 5/2004 | Baker et al. | 257/311 |
| 2005/0145919 A1* | 7/2005 | Chang et al. | 257/314 |
| 2009/0035904 A1* | 2/2009 | Bhattacharyya | 438/261 |
| 2009/0175089 A1* | 7/2009 | Eitan et al. | 365/185.28 |
| 2009/0236498 A1* | 9/2009 | Nagaraja et al. | 250/208.1 |
| 2011/0079846 A1* | 4/2011 | Yao et al. | 257/335 |
| 2011/0133276 A1* | 6/2011 | Thei et al. | 257/337 |
| 2012/0280319 A1* | 11/2012 | Roehrer | 257/337 |
| 2013/0140632 A1* | 6/2013 | Landgraf | H01L 21/02107 257/335 |
| 2015/0102405 A1* | 4/2015 | Ryu | H01L 29/42368 257/336 |

* cited by examiner

MOS TRANSISTOR HAVING A GATE DIELECTRIC WITH MULTIPLE THICKNESSES

BACKGROUND

Various voltage level metal-oxide-semiconductor (MOS) transistors, such as a CMOS transistor, a drain-extended MOS (DEMOS) transistor and a lateral-diffused MOS (LDMOS) transistor, may be selected in accordance with different applications. In power applications, a drain voltage is generally higher than a gate voltage. In order to sustain the drain voltage, the DEMOS transistor or the LDMOS transistor having higher breakdown voltage is a better choice. However, $R_{dson}$ (drain-to-source on-state resistance) of the DEMOS transistor or the LDMOS transistor is significantly greater than that of the CMOS transistor. It is noted that to raise breakdown voltage and to reduce $R_{dson}$ are conflicted with each other. Accordingly, there is a need for an improved transistor structure having low $R_{dson}$ and high breakdown voltage which is beneficial to the power applications.

BRIEF DESCRIPTION OF THE DRAWINGS

Embodiments of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for the sake of simplicity and clarity.

The singular forms "a," "an" and "the" used herein include plural referents unless the context clearly dictates otherwise. Therefore, reference to, for example, a MOS transistor includes embodiments having two or more such MOS transistors, unless the context clearly indicates otherwise. Reference throughout this specification to "one embodiment" or "an embodiment" means that a particular feature, structure, or characteristic described in connection with the embodiment is included in at least one embodiment of the present disclosure. Therefore, the appearances of the phrases "in one embodiment" or "in an embodiment" in various places throughout this specification are not necessarily all referring to the same embodiment. Further, the particular features, structures, or characteristics may be combined in any suitable manner in one or more embodiments. It should be appreciated that the following figures are not drawn to scale; rather, these figures are intended for illustration.

Figure 1:
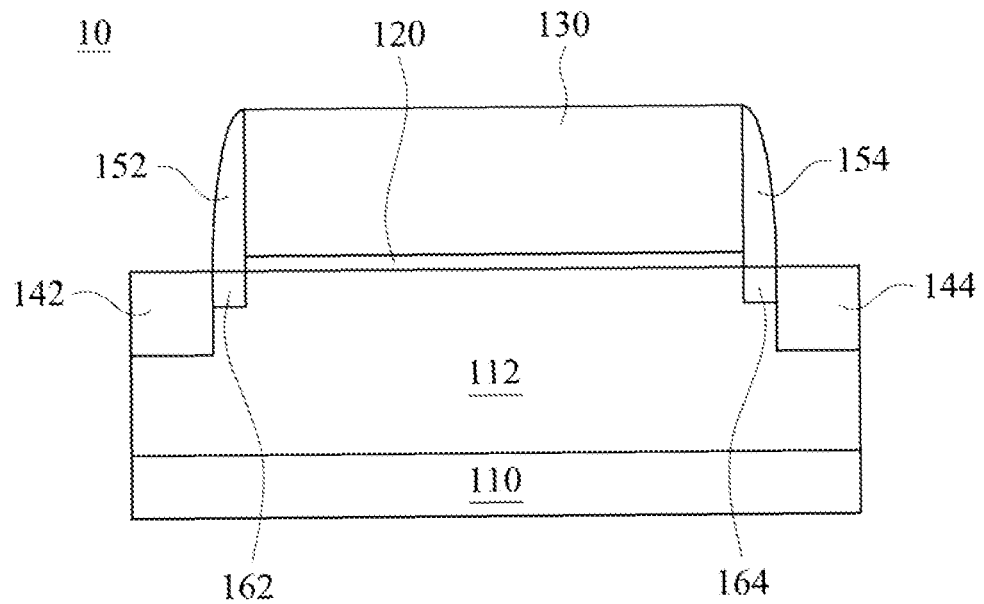
FIG. 1 is a cross-sectional view of a general CMOS transistor.

FIG. 1 is a cross-sectional view of a general CMOS transistor 10. The CMOS transistor 10 includes a semiconductor substrate 110, a well region 112, a gate dielectric layer 120, a gate electrode 130, a source region 142, a drain region 144, spacers 152, 154 and lightly doped drain (LDD) regions 162, 164. Generally, the CMOS transistor 10 has low $R_{dson}$ and low breakdown voltage compared to a DEMOS transistor or a LDMOS transistor.

Figure 2:
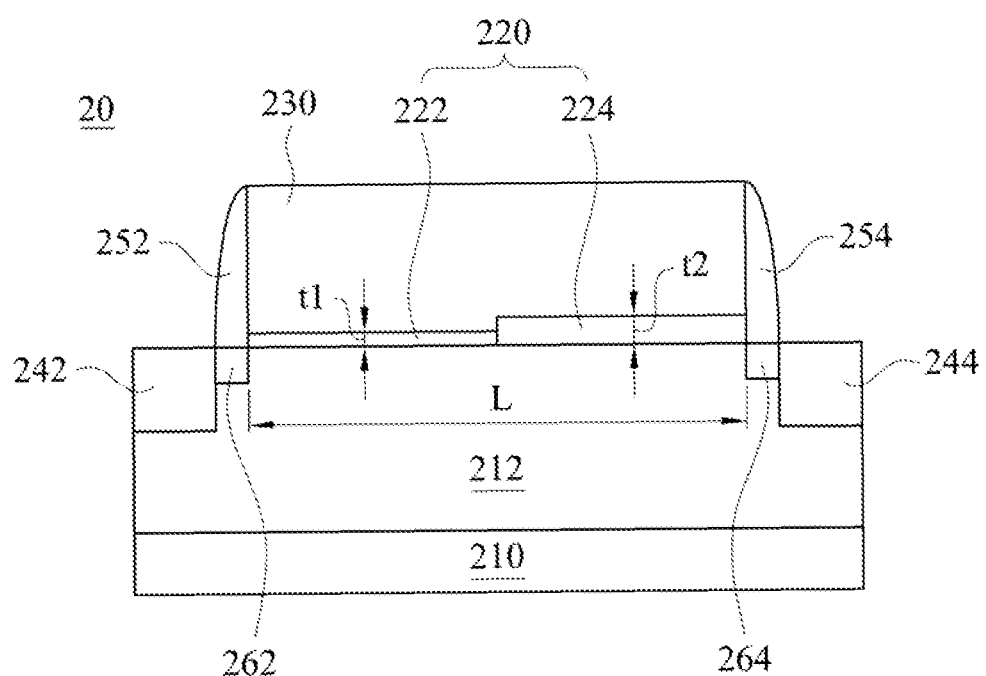
FIG. 2 is a cross-sectional view of a MOS transistor according to a first embodiment of the present disclosure.

According to various embodiments of the present disclosure, a MOS transistor in a semiconductor substrate is provided to have a high breakdown voltage while maintaining (or reducing) a low $R_{dson}$. In embodiments, the MOS transistors described below may be applied in power applications for operating voltage of a gate electrode less than or equal to 100 volts. Referring to FIG. 2, a MOS transistor 20 is illustrated according to a first embodiment of the present disclosure. The MOS transistor 20 includes a semiconductor substrate 210, a well region 212, a gate dielectric layer 220, a gate electrode 230, a source region 242 and a drain region 244.

The semiconductor substrate 210 may be made of semiconductor material such as silicon, germanium, silicon germanium, silicon carbide, and those consisting essentially of III-V compound semiconductors (e.g., GaAs and Si/Ge). The semiconductor substrate 210 may be of N-type or P-type. In one embodiment that the MOS transistor 20 is an N-type MOS transistor, the semiconductor substrate 210 is a lightly doped P-type semiconductor substrate 210.

The well region 212 of a first conductivity type extends into the semiconductor substrate 210 from an upper surface thereof. The well region 212 may be lightly or intermediately doped with dopants of the first conductivity type. The dopant concentration may depend on the maximum voltage requirement of the MOS transistor 20. For examples, the well region 212 includes P-type dopants for an N-type MOS transistor 20 or N-type dopants for a P-type transistor 20. In embodiments, a distance L of the gate electrode 230 overlapped with the well region 212 is considered as an effective channel length ($L_{ch}$) of the MOS transistor 20.

The source region 242 of a second conductivity type opposite to the first conductivity type and a drain region 244 of the second conductivity type are located in the well region 212 and on opposite sides of the gate electrode 230. For examples, the source region 242 and the drain region 244 includes N-type dopants for an N-type MOS transistor 20 or P-type dopants for a P-type transistor 20. In embodiments that the MOS transistor 20 is an N-type MOS transistor, the source region 242 and the drain region 244 are heavily doped with N-type dopants such as arsenic, phosphorus, antimony or a combination thereof.

The gate dielectric layer 220 is located over the well region 212. The gate dielectric layer 220 may be made of silicon dioxide, silicon nitride or other high k dielectric materials. In one embodiment, the gate dielectric layer 220 has a thickness in a range of 10 to 5,000 angstroms, depending on operating voltage of the gate electrode 230.

A particular feature in the current embodiment is that the gate dielectric layer 220 has a plurality of portions. As shown in FIG. 2, the gate dielectric layer 220 has a first portion 222 and a second portion 224 respectively closest to the source region 242 and the drain region 244. In embodiments, in that the second portion 224 adjoining the drain region 244 may be used to elevate the breakdown voltage, a thickness t2 of the second portion 224 is as great as possible. In embodiments, in that the first portion 222 may be used to maintain (or increase) current (e.g., linear-region drain current ($I_{dlin}$) or saturation-region drain current ($I_{dsat}$)), a thickness t1 of the first portion 222 is as small as possible. Therefore, the thickness t2 of the second portion 224 should be greater than the thickness t1 of the first portion 222.

The gate electrode 230 is disposed over the gate dielectric layer 220. Specifically, the gate electrode 230 extends from a location aligned with a sidewall of the first portion 222, along the surface of the well region 212, to a location aligned with a sidewall of the second portion 224. The gate electrode 230 may be made of a conductive material such as polysilicon (poly), metal or metal alloy. In one embodiment, the gate electrode 230 includes polysilicon.

In addition, the MOS transistor 20 further includes a first spacer 252 and a second spacer 254. The first spacer 252 is disposed on a sidewall of the first portion 222 and the gate electrode 230 and substantially aligned with one edge of the source region 242. The second spacer 254 is disposed on a sidewall of the second portion 224 and the gate electrode 230 and substantially aligned with one edge of the drain region 244. The first spacer 252 and the second spacer 254 may be made of silicon dioxide, silicon nitride or other high k dielectric materials.

Moreover, the MOS transistor 20 further includes a first lightly doped drain (LDD) region 262 of the second conductivity type and a second LDD region 264 of the second conductivity type. The first LDD region 262 is disposed beneath the first spacer 252 and adjoining the source region 242. The second LDD region 264 is disposed beneath the second spacer 254 and adjoining the drain region 244. In the embodiment that the MOS transistor 20 is an N-type MOS transistor, the first and second LDD regions 262, 264 are N-type lightly doped drain (NLDD) regions.

Figure 3:
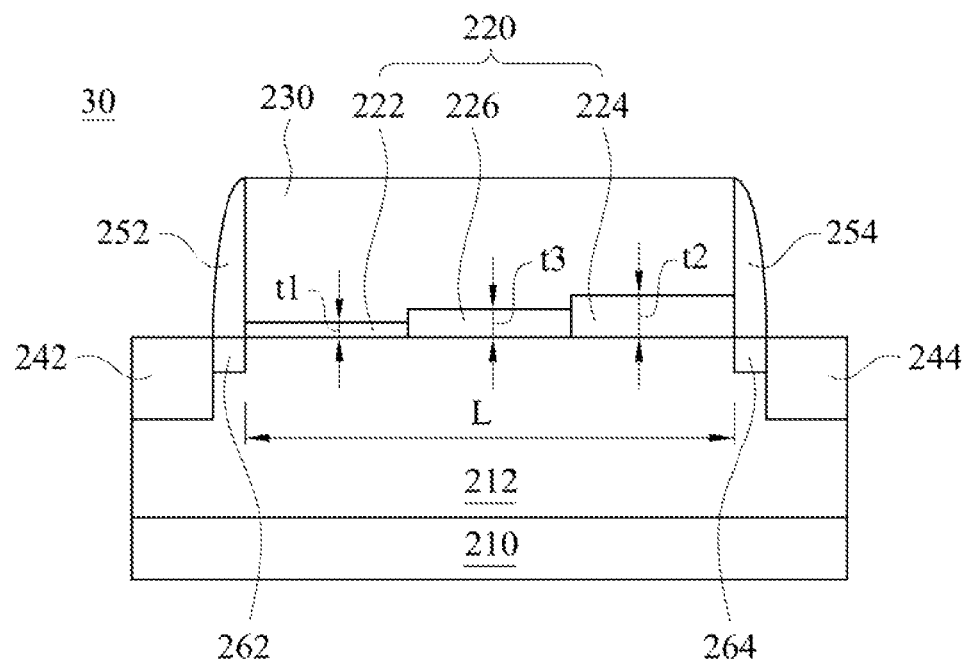
FIG. 3 is a cross-sectional view of a MOS transistor according to a second embodiment of the present disclosure.

FIG. 3 is a cross-sectional view of a MOS transistor 30 according to a second embodiment of the present disclosure. The difference between the MOS transistor 20 and the MOS transistor 30 is that the gate dielectric layer 220 of the MOS transistor 30 further includes a third portion 226 disposed between the first portion 222 and the second portion 224. In embodiments, since it is noted that the third portion 226 has a smaller effect on breakdown voltage than that of the second portion 224, a thickness t3 of the third portion 226 is not limited. However, in one embodiment, the thickness t3 is greater than the thickness t1 of the first portion 222. It is because the third portion 226 having a thickness less than the thickness t1 may be firstly broken when feeding a current from the gate electrode 230 to the drain region 244 (i.e., that the MOS transistor has a low gate-to-drain breakdown voltage).

Figure 4:
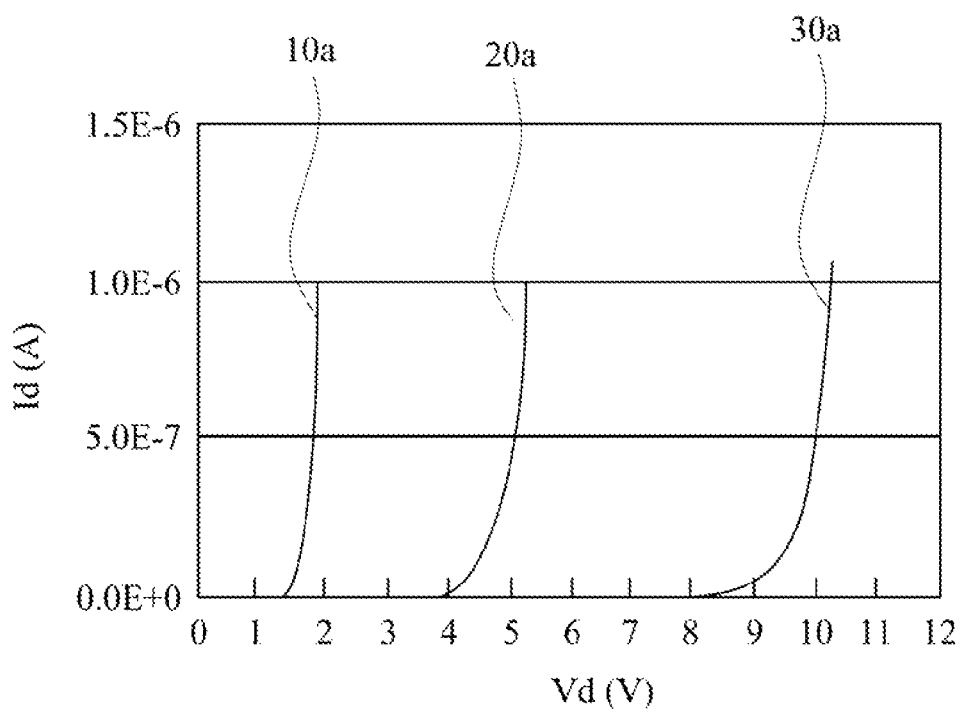
FIG. 4 are Id-Vd curves of the general MOS transistor, the MOS transistors respectively according to the first and second embodiments.

FIG. 4 are Id-Vd curves of the general CMOS transistor 10, the MOS transistor 20 and the MOS transistor 30 under a condition of Vg=0 (i.e., off-state). In the general CMOS transistor 10, a distance that the gate electrode 130 overlapped with the well region 112 is substantially equal to the distance L of the MOS transistor 20 and that of the MOS transistor 30. In various embodiments, the gate dielectric layer 120 of the general CMOS transistor 10 has a thickness of about 10-30 angstroms. The thickness t1, t2 of the MOS transistor 20 are of about 10-30 angstroms and of about 40-80 angstroms respectively. The thickness t1, t3 and t2 of the MOS transistor 30 are of about 10-30 angstroms, of about 40-80 angstroms and of about 100-150 angstroms in order. As shown in FIG. 4, the general CMOS transistor 10 (referred to a curve 10a) has lower breakdown voltage than that of the MOS transistor 20 (referred to a curve 20a) and that of the MOS transistor 30 (referred to a curve 30a), which proves that the breakdown voltage is significantly improved by adding a thick gate dielectric layer (e.g., the second portion 224) at a location adjacent to the drain region 244. In addition, the MOS transistor 30 has higher breakdown voltage than that of the MOS transistor 20 since the thickness t2 of the MOS transistor 30 is larger than the thickness t2 of the MOS transistor 20.

Figure 5:
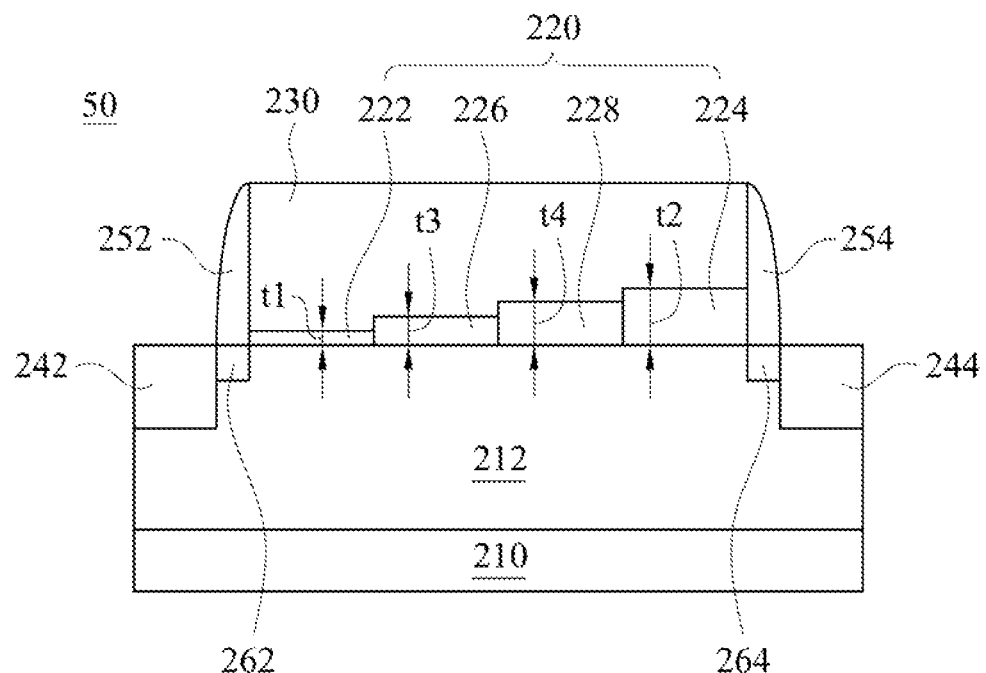
FIG. 5 is a cross-sectional view of a MOS transistor according to a third embodiment of the present disclosure.

FIG. 5 is a cross-sectional view of a MOS transistor 50 according to a third embodiment of the present disclosure. The difference between the MOS transistor 30 and the MOS transistor 50 is that the gate dielectric layer 220 of the MOS transistor 50 further includes a fourth portion 228 between the third portion 226 and the second portion 224. In various embodiments, similar to the third portion 226, the fourth portion 228 has a smaller effect on breakdown voltage than that of the second portion 224, and thus a thickness t4 of the fourth portion 228 is not limited. However, in one embodiment, the thickness t4 is greater than the thickness t1 of the first portion 222. It is because the fourth portion 228 having a thickness less than the thickness t1 may be firstly broken when feeding a current from the gate electrode 230 to the drain region 244 (i.e., that the MOS transistor has a low gate-to-drain breakdown voltage).

Figure 6:
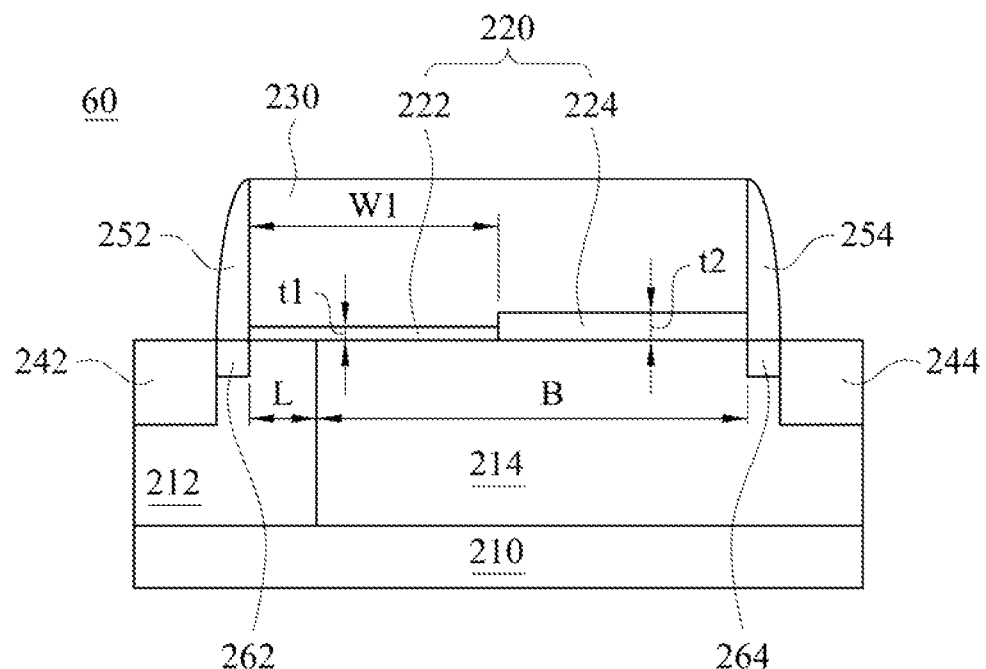
FIG. 6 is a cross-sectional view of a MOS transistor according to a fourth embodiment of the present disclosure.

FIG. 6 is a cross-sectional view of a MOS transistor 60 according to a fourth embodiment of the present disclosure. The MOS transistor 60 includes a semiconductor substrate 210, a first well region 212, a second well region 214, a gate dielectric layer 220, a gate electrode 230, a source region 242 and a drain region 244. The specific features of the semiconductor substrate 210 and the gate electrode 230 may be referred to those illustrated for the semiconductor substrate 210 and the gate electrode 230 of FIG. 2. In various embodiments, the difference between the MOS transistor 20 and the MOS transistor 60 is that the MOS transistor 60 includes the first well region 212 and the second well region 214.

The first well region 212 is of a first conductivity type and extends into the semiconductor substrate 210 from an upper surface thereof. For examples, the first well region 212 includes P-type dopants for an N-type MOS transistor 60 or N-type dopants for a P-type transistor 60. The first well region 212 may be formed by lightly or intermediately doping with dopants of the first conductivity type into a selective area of the semiconductor substrate 210.

The second well region 214 of a second conductivity type opposite to the first conductivity type extends into the semiconductor substrate 210 from an upper surface thereof and is located adjacent to the first well region 212. The second well region 214 may be formed by lightly or intermediately doping with dopants of the second conductivity type into another selective area of the semiconductor substrate 210. For examples, the second well region 214 includes N-type dopants for an N-type MOS transistor 60 or P-type dopants for a P-type transistor 60. Consequently, the second well region 214 can be used to reduce $R_{dson}$.

The source region 242 of the second conductivity type and the drain region 244 of the second conductivity type are respectively disposed in the first well region 212 and the second well region 214 and on opposite sides of the gate electrode 230. In various embodiments, other features of the source region 242 and the drain region 244 may be referred to those illustrated for the source region 242 and the drain region 244 of FIG. 2 to avoid repetition.

The gate dielectric layer 220 is located over the first well region 212 and the second well region 214. In one embodiment, the gate dielectric layer 220 has a thickness in a range of 10 to 5000 angstroms, depending on operating voltage of the gate electrode 230. A particular feature is that the gate dielectric layer 220 has a first portion 222 and a second portion 224. The first portion 222 is located over the first well region 212 and closest to the source region 242. The second portion 224 is located over the second well region 214 and closest to the drain region 244. For the same reason as that in the gate dielectric layer 220 of FIG. 2, in embodiments a thickness t1 of the first portion 222 should be less than a thickness t2 of the second portion 224.

In the current embodiment, a distance L that the gate electrode 230 overlapped with the first well region 212 (i.e., an effective channel length ($L_{ch}$)) is less than a distance B that the gate electrode 230 overlapped with the second well region 214 so as to further reduce $R_{dson}$.

In the current embodiment, the first portion 222 of the gate dielectric layer 220 extends over a portion of the second well region 214. That is, the first portion 222 has a width W1 greater than the distance L that the gate electrode 230 overlapped with the first well region 212. If the width W1 is less than the distance L, current (e.g., $I_{din}$) may be significantly reduced.

In addition, in the current embodiment, the MOS transistor 60 further includes a first spacer 252 and a second spacer 254. The specific features of the first spacer 252 and the second spacer 254 may be referred to those exemplified for the first spacer 252 and the second spacer 254 of FIG. 2.

Moreover, the MOS transistor 60 further includes a first LDD region 262 of the second conductivity type and a second LDD region 264 of the second conductivity type. The specific features of the first LDD region 262 and the second LDD region 264 may be referred to those exemplified for the first LDD region 262 and the second LDD region 264 of FIG. 2.

Figure 7:
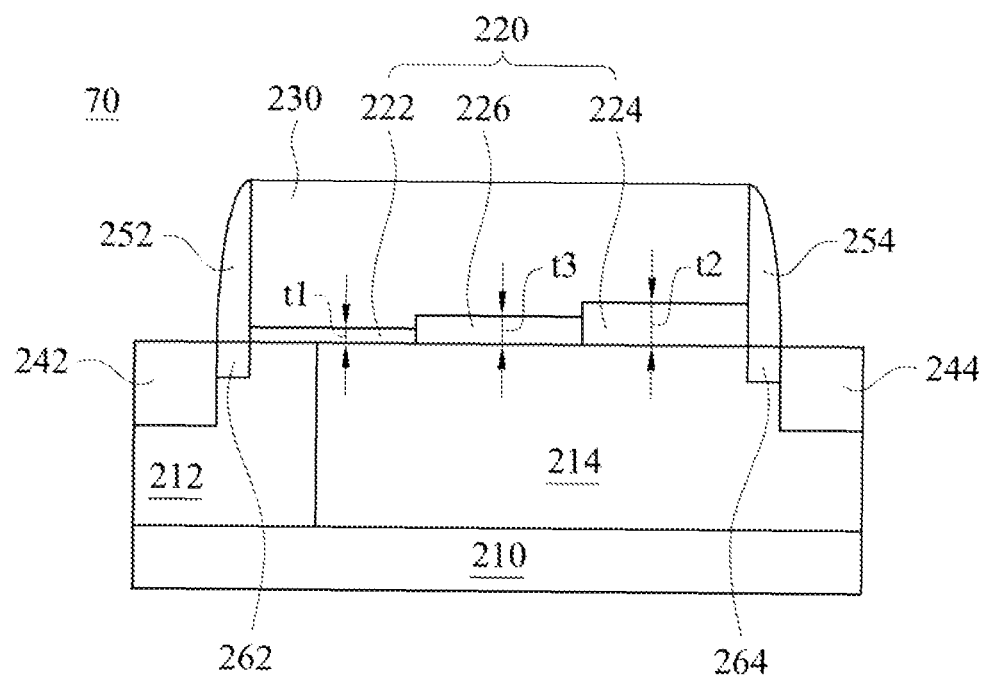
FIG. 7 is a cross-sectional view of a MOS transistor according to a fifth embodiment of the present disclosure.

FIG. 7 is a cross-sectional view of a MOS transistor 70 according to a fifth embodiment of the present disclosure. The difference between the MOS transistor 60 and the MOS transistor 70 is that the gate dielectric layer 220 of the MOS transistor 70 further includes a third portion 226 between the first portion 222 and the second portion 224. In one embodiment, the third portion 226 has a thickness t3 greater than the thickness t1 of the first portion 222 for the same reason described above of FIG. 3.

Figure 8:
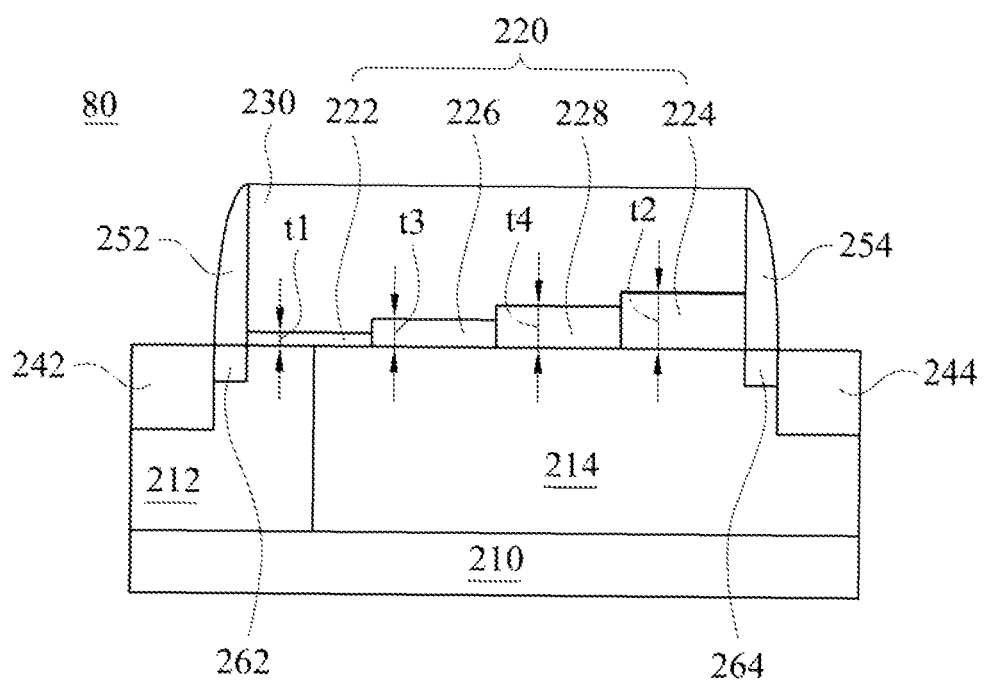
FIG. 8 is a cross-sectional view of a MOS transistor according to a sixth embodiment of the present disclosure.

FIG. 8 is a cross-sectional view of a MOS transistor 80 according to a sixth embodiment of the present disclosure. The difference between the MOS transistor 70 and the MOS transistor 80 is that the gate dielectric layer 220 of the MOS transistor 80 further includes a fourth portion 228 between the third portion 226 and the second portion 224. In the illustrated embodiment, the fourth portion 228 has a thickness t4 greater than the thickness t1 of the first portion 222 for the same reason described above of FIG. 5.

FIGS. 9A-9E are cross-sectional views at various stages of manufacturing the MOS transistor 70 according to various embodiments of the present disclosure. To clarify description and avoid repetition, like numerals and letters used to describe the MOS transistor 70 above are used for the various elements in the coming figures. Also, reference numerals described previously may not be described again in detail herein.

Figure 9A:
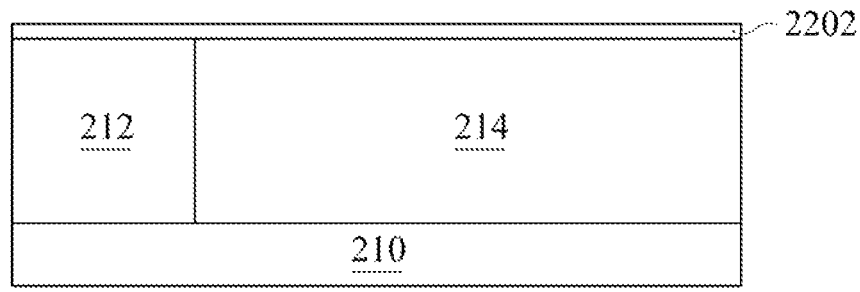
FIGS. 9A-9E are cross-sectional views at various stages of manufacturing a MOS transistor according to various embodiments of the present disclosure.

As shown in FIG. 9A, a semiconductor substrate 210 is provided, and a first well region 212 and a second well region 214 are then formed therein. For an example, the first well region 212 is formed by implanting dopants of first conductivity type in a selective area of the semiconductor substrate 210. The second well region 214 is formed by implanting dopants of second conductivity type in another selective area of the semiconductor substrate 210 prior or next to the step of forming the first well region 212. Subsequently, a first dielectric material layer 2202 is formed covering the first well region 212 and the second well region 214 by thermally grown or deposition.

Figure 9B:
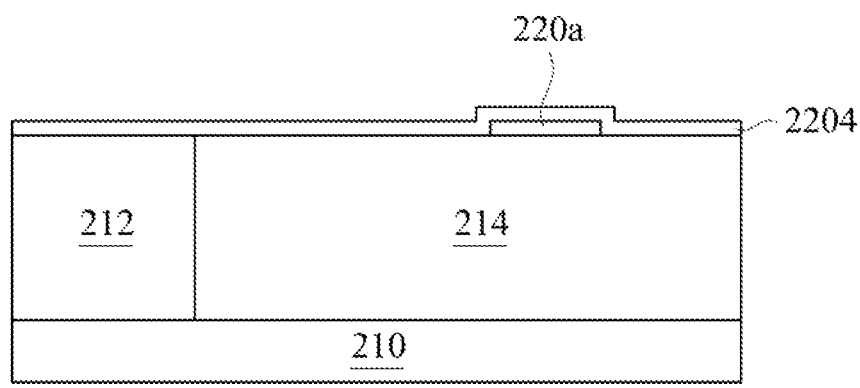

Continuing in FIG. 9B, the first dielectric material layer 2202 is patterned to form a first dielectric layer 220a over the expected position of the second portion 224 of FIG. 7. A second dielectric material layer 2204 is then blanket formed covering the first dielectric layer 220a.

Figure 9C:
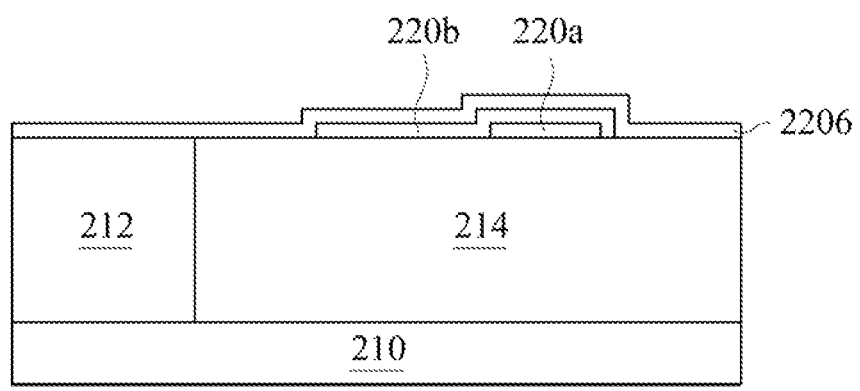

Referring now to FIG. 9C, the second dielectric material layer 2204 is patterned to form a second dielectric layer 220b over the expected positions of the second portion 224 and the third portion 226 of FIG. 7. Next, a third dielectric material layer 2206 is blanket formed on the second dielectric layer 220b.

Figure 9D:
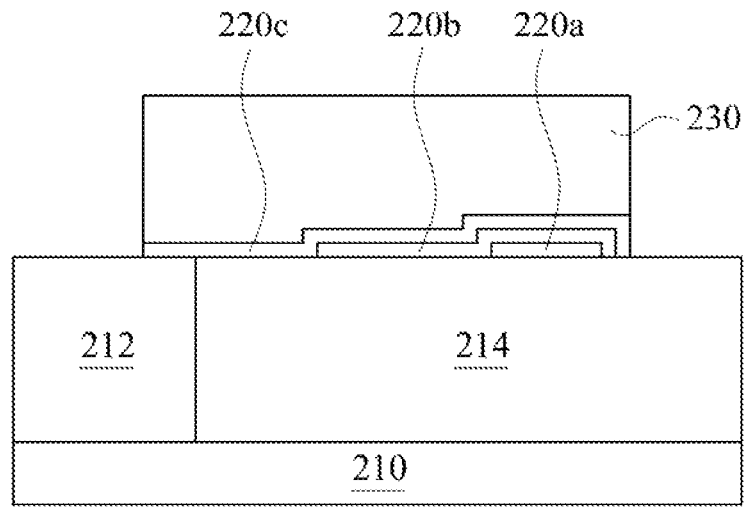

Continuing in FIG. 9D, a gate material layer (not shown) is formed covering the structure of FIG. 9C, and the gate material layer and the third dielectric material layer 2206 are then patterned to form the gate electrode 230 and the third dielectric layer 220c.

Figure 9E:
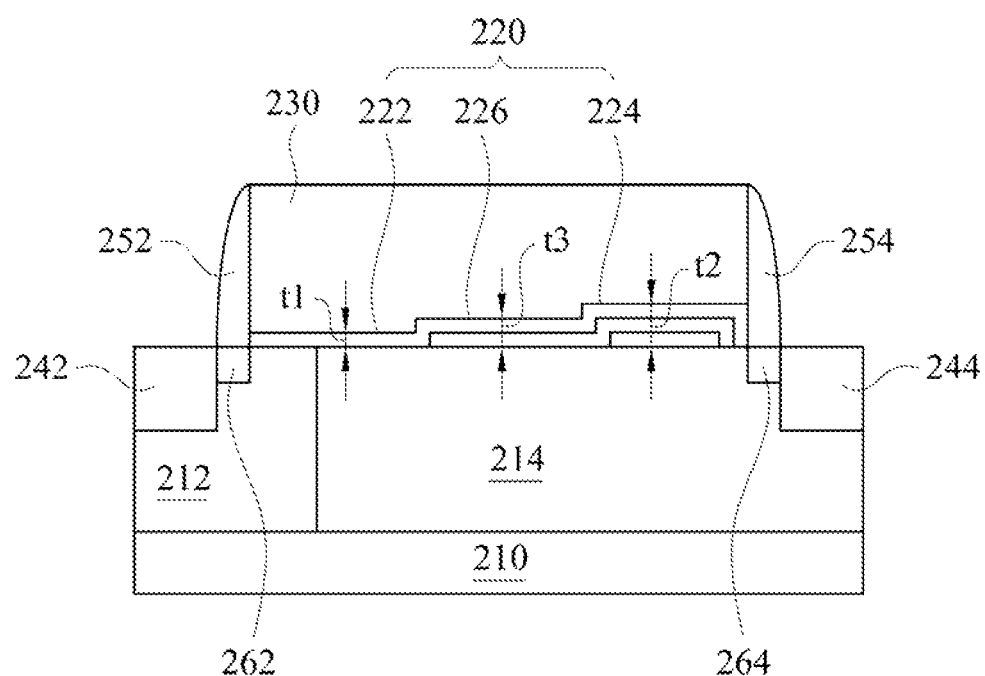

As shown in FIG. 9E, first and second LDD regions 262, 264, first and second spacers 252, 254, and source and drain regions 242, 244 are formed by any conventional method. For an example, a lightly ion implantation process is performed by implanting the dopants of the first conductivity type into selective areas of the first well region 212 and the second well region 214 to form the first and second LDD regions 262, 264. Next, deposition, photolithographic and etching processes are sequentially performed to form the first and second spacers 252, 254 at the opposite sidewalls of the gate electrode 230. The dopants of the first conductivity type are then respectively implanted into a selective area of first well region 212 and a selective area of the second well region 214 to form the source and drain regions 242, 244. It is understood that the aforementioned operations in the method for fabricating the MOS transistor 70 are only embodiments for fabricating the MOS transistor of the embodiments of the present disclosure and not limited thereto.

The embodiments of the present disclosure discussed above have advantages over existing structures and methods, and the advantages are summarized below. In various embodiments, a thick portion of the gate dielectric layer adjacent to the drain region (e.g., the second portion of FIGS. 2-3 and 5-8) is provided, so as to raise breakdown voltage while maintaining a low $R_{dson}$. A thin portion of the gate dielectric layer adjacent to the source region (e.g., the first portion of FIGS. 2-3 and 5-8) is provided so as to maintain or increase current. Collectively, the MOS transistor according to the embodiments of the present disclosure exhibits high breakdown voltage, low $R_{dson}$ and high current. Moreover, $R_{dson}$ may be further reduced by disposing a doped well region that has a same conductivity type dopants (e.g., the second well region of FIGS. 5-8) as the source and drain regions adjacent to the drain region.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A metal-oxide-semiconductor (MOS) transistor in a semiconductor substrate, comprising:
   a well region of a first conductivity type extending into the semiconductor substrate;
   a source region of a second conductivity type opposite to the first conductivity type and a drain region of the second conductivity type in opposite sides of the well region, wherein the well region has a first portion laterally adjacent to the drain region, a second portion laterally adjacent to the source region and a third portion laterally between the first portion and the second portion;
   a first gate dielectric layer over and overlapped with the first portion of the well region;
   a second gate dielectric layer over and overlapped with the first portion and the third portion of the well region, and over the first gate dielectric layer, and in contact with a side surface of the first gate dielectric layer, wherein the side surface of the first gate dielectric layer is adjacent to the drain region;
   a third gate dielectric layer over and overlapped with the first portion, the second portion and the third portion of the well region, and over the first gate dielectric layer and the second gate dielectric layer, and in contact with a side surface of the second gate dielectric layer, wherein the side surface of the second gate dielectric layer is adjacent to the drain region; and
   a gate electrode over the first gate dielectric layer, the second gate dielectric layer and the third gate dielectric layer.

2. The MOS transistor of claim 1, further comprising a first spacer and a second spacer, wherein the first spacer is positioned on a sidewall of the gate electrode and substantially aligned with one edge of the source region, and the second spacer is positioned on another sidewall of the gate electrode and substantially aligned with one edge of the drain region.

3. The MOS transistor of claim 2, further comprising a first lightly doped drain (LDD) region of the second conductivity type and a second LDD region of the second conductivity type, wherein the first LDD region is positioned beneath the first spacer and adjoining the source region, the second LDD region is positioned beneath the second spacer and adjoining the drain region.

4. The MOS transistor of claim 1, wherein the source region and the drain region comprise N-type dopants, and the well region comprises P-type dopants.

5. A metal-oxide-semiconductor (MOS) transistor in a semiconductor substrate, comprising:
   a first well region of a first conductivity type extending into the semiconductor substrate;
   a second well region of a second conductivity type opposite to the first conductivity type extending into the semiconductor substrate and located adjacent to the first well region;
   a source region of the second conductivity type and a drain region of the second conductivity type respectively in the first well region and the second well region, wherein the second well region has a first portion laterally adjacent to the drain region, a second portion laterally adjacent to the first well region and a third portion laterally between the first portion and the second portion;
   a first gate dielectric layer over and overlapped with the first portion of the second well region;
   a second gate dielectric layer over and overlapped with the first portion and the third portion of the second well region, and over the first gate dielectric layer, and in contact with a side surface of the first gate dielectric layer, wherein the side surface of the first gate dielectric layer is adjacent to the drain region;
   a third gate dielectric layer over and overlapped with the first portion, the second portion and the third portion of the second well region and the first well region, and over the first gate dielectric layer and the second gate dielectric layer, and in contact with a side surface of the second gate dielectric layer, wherein the side surface of the second gate dielectric layer is adjacent to the drain region; and
   a gate electrode over the first gate dielectric layer, the second gate dielectric layer and the third gate dielectric layer.

6. The MOS transistor of claim 5, wherein a distance that the gate electrode overlaps with the first well region is less than a distance that the gate electrode overlaps with the second well region.

7. The MOS transistor of claim 5, further comprising a first spacer and a second spacer, the first spacer on a sidewall of the gate electrode and substantially aligned with one edge of the source region, the second spacer on another sidewall of the gate electrode and substantially aligned with one edge of the drain region.

8. The MOS transistor of claim 7, further comprising a first lightly doped drain (LDD) region of the second conductivity type and a second LDD region of the second conductivity type, the first LDD region beneath the first spacer and adjoining the source region, the second LDD region beneath the second spacer and adjoining the drain region.

* * * * *